(12) United States Patent
Wang et al.

(10) Patent No.: US 12,063,038 B2
(45) Date of Patent: Aug. 13, 2024

(54) RELIABLE MULTI-INFORMATION ENTROPY PHYSICAL UNCLONABLE FUNCTION (PUF) FOR INTERNET OF THINGS SECURITY

(71) Applicant: Wenzhou University, Zhejiang (CN)

(72) Inventors: Pengjun Wang, Zhejiang (CN); Li Ni, Zhejiang (CN); Di Zhou, Zhejiang (CN); Yue Jun Zhang, Zhejiang (CN); Bo Chen, Zhejiang (CN); Xiaochun Guan, Zhejiang (CN)

(73) Assignee: Wenzhou University, Zhejiang (CN)

( * ) Notice: Subject to any disclaimer, the term of this patent is extended or adjusted under 35 U.S.C. 154(b) by 149 days.

(21) Appl. No.: 17/900,867

(22) Filed: Sep. 1, 2022

(65) Prior Publication Data
US 2023/0092828 A1     Mar. 23, 2023

(30) Foreign Application Priority Data
Sep. 15, 2021   (CN) .......................... 202111080382.X

(51) Int. Cl.
*H03K 19/17768*     (2020.01)
*H03K 19/173*       (2006.01)
*H03K 19/17736*     (2020.01)

(52) U.S. Cl.
CPC ... *H03K 19/17768* (2013.01); *H03K 19/1737* (2013.01); *H03K 19/1774* (2013.01)

(58) Field of Classification Search
None
See application file for complete search history.

(56) References Cited

U.S. PATENT DOCUMENTS

2012/0293354 A1* 11/2012 Suzuki .................... G06F 7/588
                                                             341/173

OTHER PUBLICATIONS

Daisuke Suzuki et al., "The Glitch PUF: A New Delay-PUF Architecture Exploiting Glitch Shapes", Cryptographic Hardware and Embedded Systems, CHES 2010, 12th International Workshop, Santa Barbara, CA, USA, Aug. 17-20, 2010, pp. 366-382.

* cited by examiner

*Primary Examiner* — Jany Richardson
(74) *Attorney, Agent, or Firm* — JCIPRNET

(57) ABSTRACT

A reliable multi-information entropy PUF for Internet of Things security includes a control circuit, a data register, 128 glitch generation circuits, a 128-to-1 multiplexer, and a Schmidt glitch sampling module. The control circuit controls the data register to generate a square signal, the 128 glitch generation circuits to generate glitch signals to be output and the 128-to-1 multiplexer to select the glitch signals to be output. The Schmidt glitch sampling module samples the glitch signals to obtain PUF response outputs. Each glitch generation circuit generates a glitch signal by means of a fully symmetrical structure. The Schmidt glitch sampling module comprises a first PMOS transistor, a second PMOS transistor, a third PMOS transistor, a fourth PMOS transistor, a first NMOS transistor, a second NMOS transistor, a third NMOS transistor, a fourth NMOS transistor, a buffer module and a D flip-flop.

3 Claims, 5 Drawing Sheets

RELIABLE MULTI-INFORMATION ENTROPY PHYSICAL UNCLONABLE FUNCTION (PUF) FOR INTERNET OF THINGS SECURITY

CROSS-REFERENCE TO RELATED APPLICATION

This application claims the priority benefit of China application no. 202111080382.X, filed on Sep. 15, 2021. The entirety of the above-mentioned patent application is hereby incorporated by reference herein and made a part of this specification.

BACKGROUND

1. Technical Field

The invention relates to a physical unclonable function (PUF), in particular to a reliable multi-information entropy PUF for Internet of Things security.

2. Description of Related Art

With the development of the Internet of Things, Internet of Things security has received extensive attention. Traditional measures store keys in a non-volatile memory to guarantee Internet of Things security. However, such measures are extremely likely to be suffered from machine learning (ML) attacks, leading to key exposures. For different challenges, the physical unclonable function (PUF) generates specific challenge response pairs (CRPs) by means of random process deviations existing in the fabrication process of integrated circuits. As a lightweight security primitive, the PUF can generate high-security keys capable of resisting various physical attacks, and thus can effectively guarantee the security of physical entities such as RFID and smart cards.

The Glitch PUF with good nonlinear characteristics can resist the threat of modeling attacks and guarantee information security. Suzuki et al. (described in "The Glitch PUF: A New Delay-PUF Architecture Exploiting Glitch Shapes", published in CHES, Aug. 17, 2010) put forward a Glitch PUF architecture capable of generating a nonlinear glitch waveform by means of a delay variable between gate circuits. The Glitch PUF generates glitches through a glitch generation circuit, and acquires glitch signals and converts the glitch signals into output responses through a multi-stage delay sampling circuit. However, when the Glitch PUF works normally, glitch signals (i.e., noise) will be generated due to jitters of a power supply and will affect sampling results of the multi-stage delay sampling circuit, so the output responses of the Glitch PUF will be affected by noise, and the stability is poor. In addition, the Glitch PUF is prone to being affected by temperature and voltage fluctuations due to its asymmetric circuit structure, thus being unsatisfying in reliability.

SUMMARY

A reliable multi-information entropy PUF for Internet of Things security includes a control circuit, a data register, 128 glitch generation circuits, a 128-to-1 multiplexer, and a Schmidt glitch sampling module The data register has an input terminal and an output terminal. Each one of the 128 glitch generation circuits has an input terminal, an output terminal and a control terminal. The 128-to-1 multiplexer has 128 input terminals, a selection terminal and an output terminal. The Schmidt glitch sampling module has an input terminal and an output terminal. The control circuit is connected to the input terminal of the data register, the control terminal of each one of the 128 glitch generation circuits, and the selection terminal of the 128-to-1 multiplexer. The output terminal of the data register is connected to the input terminals of the 128 glitch generation circuits. The output terminals of the 128 glitch generation circuits are connected to the 128 input terminals of the 128-to-1 multiplexer in a one-to-one corresponding manner. The output terminal of the 128-to-1 multiplexer is connected to the input terminal of the Schmidt glitch sampling module. The control circuit is used for controlling the data register to generate a square signal that is output via the output terminal of the data register to control the 128 glitch generation circuits to generate glitch signals to be output and to control the 128-to-1 multiplexer to select the glitch signals to be output. The Schmidt glitch sampling module is used for sampling glitch signals input thereto to obtain a PUF response output. Each one of the glitch generation circuits generates a glitch signal by means of a fully symmetrical structure. The Schmidt glitch sampling module includes a first p-type metal-oxide-semiconductor (PMOS) transistor, a second PMOS transistor, a third PMOS transistor, a fourth PMOS transistor, a first n-type metal-oxide-semiconductor (NMOS) transistor, a second NMOS transistor, a third NMOS transistor, a fourth NMOS transistor, a buffer module and a D flip-flop. The buffer module is formed by n buffers that are connected in series, wherein n is an integer greater than or equal to 2. An input terminal of a first buffer of the n buffers is an input terminal of the buffer module. An output terminal of the $j^{th}$ buffer of the n buffers is connected to an input terminal of the $(j+1)^{th}$ buffer, wherein j=1, 2, ..., n−1. An output terminal of the $n^{th}$ buffer of the n buffers is an output terminal of the buffer module. The D flip-flop has a clock terminal, an input terminal and an output terminal. A power source is accessed to a source terminal of the first PMOS transistor, a source terminal of the fourth PMOS transistor and a drain terminal of the third NMOS transistor. A drain terminal of the first PMOS transistor, a source terminal of the second PMOS transistor and a source terminal of the third PMOS transistor are connected. A gate terminal of the first PMOS transistor, a gate terminal of the second PMOS transistor, a gate terminal of the first NMOS transistor and a gate terminal of the second NMOS transistor are connected to a first connecting terminal which is the input terminal of the Schmidt glitch sampling module. A drain terminal of the second PMOS transistor, a drain terminal of the first NMOS transistor, a gate terminal of the third PMOS transistor, a gate terminal of the third NMOS transistor, a gate terminal of the fourth PMOS transistor and a gate terminal of the fourth NMOS transistor are connected. A drain terminal of the third PMOS transistor is grounded, a drain terminal of the fourth PMOS transistor, a drain terminal of the fourth NMOS transistor, the input terminal of the buffer module and the input terminal of the D flip-flop are connected. A source terminal of the first NMOS transistor, a drain terminal of the second NMOS transistor and a source terminal of the third NMOS transistor are connected. A source terminal of the second NMOS transistor is grounded. A source terminal of the fourth NMOS transistor is grounded. The output terminal of the buffer module and the clock terminal of the D flip-flop are connected, and the output terminal of the D flip-flop is the output terminal of the Schmidt glitch sampling module.

Each glitch generation circuit of the 128 glitch generation circuits includes four two-input OR gates that are identical in structure, four inverters that are identical in structure, two buffers that are identical in structure, two two-input AND gates that are identical in structure, a two-input XOR gate, and eight delay modules that identical in structure. Each one of the four two-input OR gates has a first input terminal, a second input terminal and an output terminal. Each one of the two two-input AND gates has a first input terminal, a second input terminal and an output terminal. The two-input XOR gate has a first input terminal, a second input terminal and an output terminal. Each one of the eight delay modules has an input terminal, an output terminal and a control terminal. The first input terminals and the second input terminals of the fourth two-input OR gates are connected to a second connecting terminal which is the input terminal of the glitch generation circuit. An output terminal of a first two-input OR gate of the four two-input OR gates is connected to an input terminal of a first inverter of the four inverters, an output terminal of a second two-input OR gate of the four two-input OR gates is connected to an input terminal of the first buffer. An output terminal of a third two-input OR gate of the four two-input OR gates is connected to an input terminal of a second inverter of the four inverters. An output terminal of a fourth two-input OR gate of the four two-input OR gates is connected to the input terminal of the second buffer. The output terminal of the first inverter is connected to an input terminal of a first delay module of the eight delay modules. An output terminal of the first buffer is connected to an input terminal of a second delay module of the eight delay modules. An output terminal of the second inverter is connected to an input terminal of a third delay module of the eight delay modules. The output terminal of the second buffer is connected to the input terminal of the fourth delay module of the eight delay modules. An output terminal of the first delay module is connected to a first input terminal of a first two-input AND gate of the two two-input AND gates. An output terminal of the second delay module is connected to a second input terminal of the first two-input AND gate. An output terminal of the third delay module is connected to a first input terminal of a second two-input AND gate of the two two-input AND gates. An output terminal of the fourth delay module of the eight delay modules is connected to a second input terminal of the second two-input AND gate. An output terminal of the first two-input AND gate is connected to an input terminal of the fifth delay module of the eight delay modules and an input terminal of the sixth delay module of the eight delay modules. An output terminal of the second two-input AND gate is connected to an input terminal of the seventh delay module of the eight delay modules and an input terminal of an eighth delay module of the eight delay modules. An output terminal of the fifth delay module and an output terminal of the sixth delay module are connected to an input terminal of a third inverter of the four inverters. An output terminal of the seventh delay module and an output terminal of the eighth delay module are connected to an input terminal of a fourth inverter of the four inverters. An output terminal of the third inverter is connected to a first input terminal of the two-input XOR gate. An output terminal of the fourth inverter is connected to a second input terminal of the two-input XOR gate. An output terminal of the two-input XOR gate is the output terminal of the glitch generation circuit, and the control terminals of the eight delay modules are connected to a third connecting terminal which is the control terminal of the glitch generation circuit.

Each delay module of the eight delay modules includes four buffers and a 4-to-1 multiplexer. The 4-to-1 multiplexer has four input terminals, an output terminal and a selection terminal. The selection terminal of the 4-to-1 multiplexer is the control terminal of the delay module. The output terminal of the 4-to-1 multiplexer is the output terminal of the delay module. Output terminals of the four buffers are connected to the four input terminals of the 4-to-1 multiplexer in a one-to-one corresponding manner. The four buffers includes a first buffer, a second buffer, a third buffer and a fourth buffer. An input terminal of the first buffer is the input terminal of the delay module. An input terminal of the second buffer is connected to the output terminal of the first buffer. An input terminal of the third buffer is connected to the output terminal of the second buffer, and an input terminal of the fourth buffer is connected to the output terminal of the third buffer.

DESCRIPTION OF THE EMBODIMENTS

The invention will be described in further detail below in conjunction with the accompanying drawings and embodiments.

The technical issue to be settled by the invention is to provide a reliable multi-information entropy PUF for Internet of Things security, which is able to generate stable output responses, unlikely to be affected by temperature and voltage fluctuations, and high in reliability.

Figure 1:
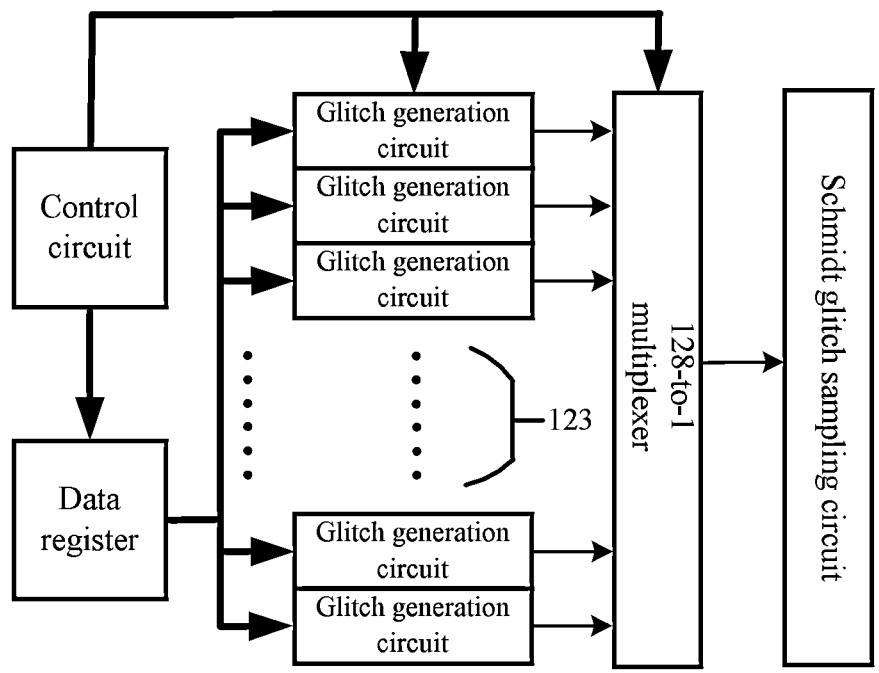
FIG. 1 is a structural diagram of a reliable multi-information entropy PUF for Internet of Things security according to the invention.
Figure 2:
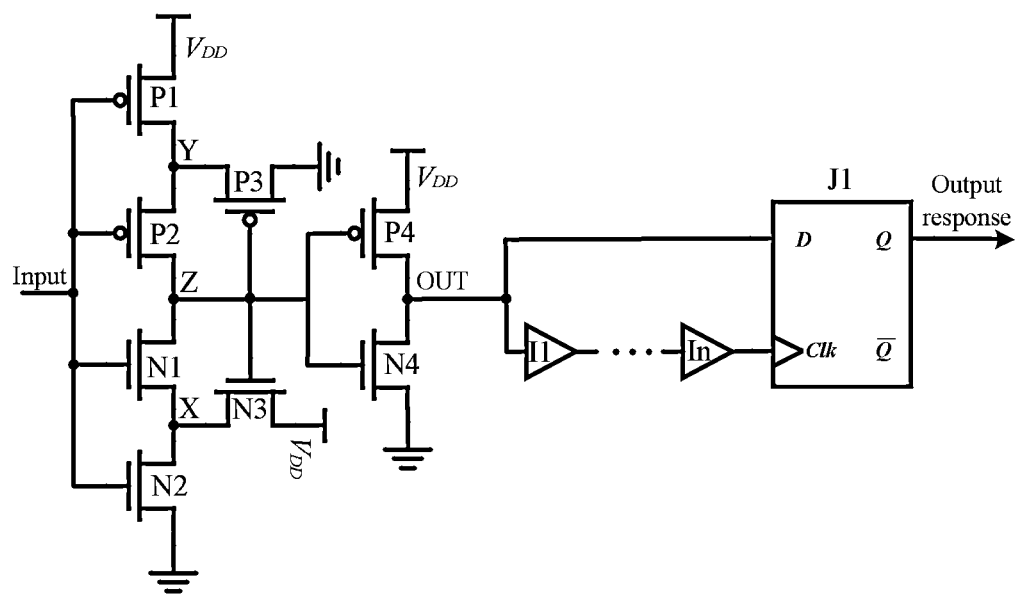
FIG. 2 is a circuit diagram of a Schmidt glitch sampling module of the reliable multi-information entropy PUF for Internet of Things security according to the invention.

Embodiment: As shown in FIG. 1 and FIG. 2, a reliable multi-information entropy PUF for Internet of Things security includes a control circuit, a data register, 128 glitch generation circuits, a 128-to-1 multiplexer, and a Schmidt glitch sampling module. The data register has an input terminal and an output terminal. Each glitch generation circuit has an input terminal, an output terminal and a control terminal. The 128-to-1 multiplexer has 128 input terminals, a selection terminal and an output terminal. The Schmidt glitch sampling module has an input terminal and an output terminal. The control circuit is connected to the input terminal of the data register. The control terminal of each glitch generation circuit is connected to the selection terminal of the 128-to-1 multiplexer. The output terminal of the data register is connected to the input terminals of the 128 glitch generation circuits. The output terminals of the 128 glitch generation circuits are connected to the 128 input terminals of the 128-to-1 multiplexer in a one-to-one corresponding manner. The output terminal of the 128-to-1 multiplexer is connected to the input terminal of the Schmidt glitch sampling module. The control circuit is used for controlling the data register to generate a square signal that is output via the output terminal of the data register to control the 128 glitch generation circuits to generate glitch signals to be output and to control the 128-to-1 multiplexer to select the glitch signals to be output. The Schmidt glitch sampling module is used for sampling glitch signals input thereto to obtain a PUF response output. Each glitch generation circuit generates a glitch signal by means of a fully symmetrical structure. The Schmidt glitch sampling module includes a first PMOS transistor P1, a second PMOS transistor P2, a third PMOS transistor P3, a fourth PMOS transistor P4, a first NMOS transistor N1, a second NMOS transistor N2, a third NMOS transistor N3, a fourth NMOS transistor N4, a buffer module and a D flip-flop J1. The buffer module is formed by n buffers I1-In that are connected in series, wherein n is an integer greater than or equal to 2. An input terminal of the first buffer I1 is an input terminal of the buffer module. An output terminal of the $j^{th}$ buffer is connected to an input terminal of the $(j+1)^{th}$ buffer, wherein j=1, 2, . . . , n−1. An output terminal of the $n^{th}$ buffer In is an output terminal of the buffer module. The D flip-flop J1 has a clock terminal, an input terminal and an output terminal. A power source VDD is accessed to a source terminal of the first PMOS transistor P1, a source terminal of the fourth PMOS transistor P4 and a drain terminal of the third NMOS transistor N3. A drain terminal of the first PMOS transistor P1, a source terminal of the second PMOS transistor P2 and a source terminal of the third PMOS transistor P3 are connected at a node Y. A gate terminal of the first PMOS transistor P1, a gate terminal of the second PMOS transistor P2, a gate terminal of the first NMOS transistor N1 and a gate terminal of the second NMOS transistor N2 are connected to a first connecting terminal which is the input terminal of the Schmidt glitch sampling module. A drain terminal of the second PMOS transistor P2, a drain terminal of the first NMOS transistor N1, a gate terminal of the third PMOS transistor P3, a gate terminal of the third NMOS transistor N3, a gate terminal of the fourth PMOS transistor P4 and a gate terminal of the fourth NMOS transistor N4 are connected at a node Z. A drain terminal of the third PMOS transistor P3 is grounded. A drain terminal of the fourth PMOS transistor P4, a drain terminal of the fourth NMOS transistor N4, the input terminal of the buffer module and the input terminal of the D flip-flop J1 are connected at a node OUT. A source terminal of the first NMOS transistor N1, a drain terminal of the second NMOS transistor N2 and a source terminal of the third NMOS transistor N3 are connected at a node X. A source terminal of the second NMOS transistor N2 is grounded. A source terminal of the fourth NMOS transistor N4 is grounded. The output terminal of the buffer module and the clock terminal of the D flip-flop J1 are connected, and the output terminal of the D flip-flop J1 is the output terminal of the Schmidt glitch sampling module.

Figure 3:
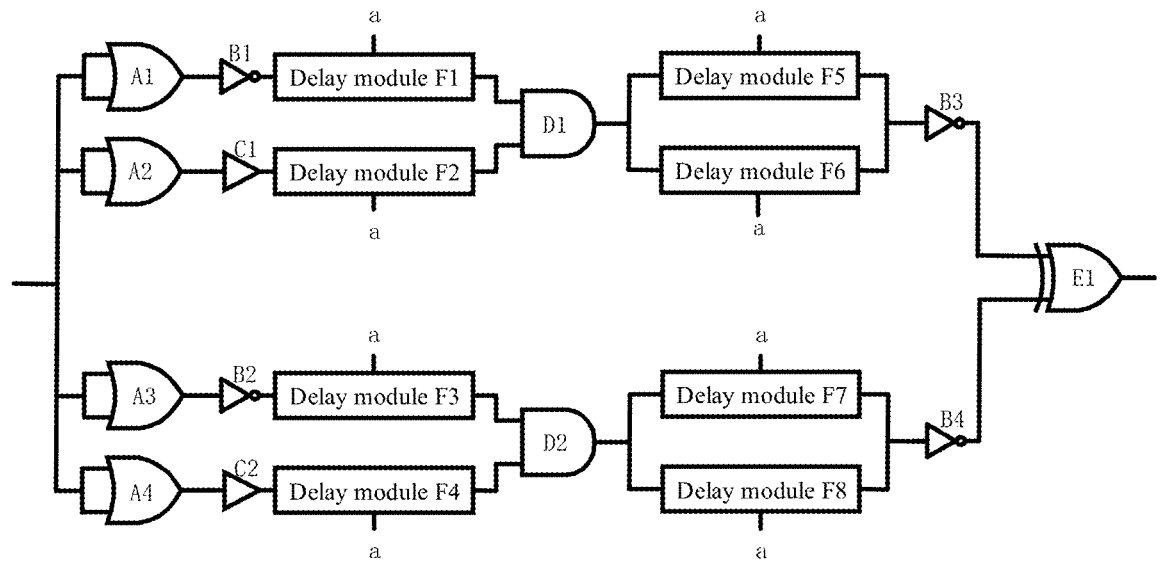
FIG. 3 is a circuit diagram of a glitch generation circuit of the reliable multi-information entropy PUF for Internet of Things security according to the invention.

As shown in FIG. 3, in this embodiment, each glitch generation circuit includes four two-input OR gates A1-A4 that are identical in structure, four inverters B1-B4 that are identical in structure, two buffers C1 and C2 that are identical in structure, two two-input AND gates D1 and D2 that are identical in structure, a two-input XOR gate E1, and eight delay modules F1-F8 that identical in structure. Each one of the two-input OR gates A1-A4 has a first input terminal, a second input terminal and an output terminal. Each one of the two-input AND gates D1-D2 has a first input terminal, a second input terminal and an output terminal. The two-input XOR gate E1 has a first input terminal, a second input terminal and an output terminal. Each one of the delay modules F1-F8 has an input terminal, an output terminal and a control terminal. The first input terminals and the second input terminals of the fourth two-input OR gates A1-A4 are connected to a second connecting terminal (not labeld) which is the input terminal of the glitch generation circuit. The output terminal of the first two-input OR gate A1 is connected to the input terminal of the first inverter B1. The output terminal of the second two-input OR gate A2 is connected to the input terminal of the first buffer C1. The output terminal of the third two-input OR gate A3 is connected to the input terminal of the second inverter B2. The output terminal of the fourth two-input OR gate A4 is connected to the input terminal of the second buffer C2. The output terminal of the first inverter B1 is connected to the input terminal of the first delay module F1. The output terminal of the first buffer C1 is connected to the input terminal of the second delay module F2. The output terminal of the second inverter B2 is connected to the input terminal of the third delay module F3. The output terminal of the second buffer C2 is connected to the input terminal of the fourth delay module F4. The output terminal of the first delay module F1 is connected to the first input terminal of the first two-input AND gate D1, and the output terminal of the second delay module F2 is connected to the second input terminal of the first two-input AND gate D1. The output terminal of the third delay module F3 is connected to the first input terminal of the second two-input AND gate D2, and the output terminal of the fourth delay module F4 is connected to the second input terminal of the second two-input AND gate D2. The output terminal of the first two-input AND gate D1 is connected to the input terminal of the fifth delay module F5 and the input terminal of the sixth delay module F6. The output terminal of the second two-input AND gate D2 is connected to the input terminal of the seventh delay module F7 and the input terminal of the eighth delay module F8. The output terminal of the fifth delay module F5 and the output terminal of the sixth delay module F6 are connected to the input terminal of the third inverter B3. The output terminal of the seventh delay module F7 and the output terminal of the eighth delay module F8 are connected to the input terminal of the fourth inverter B4. The output terminal of the third inverter B3 is connected to the first input terminal of the two-input XOR gate E1, and the output terminal of the fourth inverter B4 is connected to the second input terminal of the two-input XOR gate E1. The output terminal of the two-input XOR gate E1 is the output terminal of the glitch generation circuit, and the control terminals of the eight delay modules F1-F8 are connected to a third connecting terminal a which is the control terminal of the glitch generation circuit.

Figure 4:
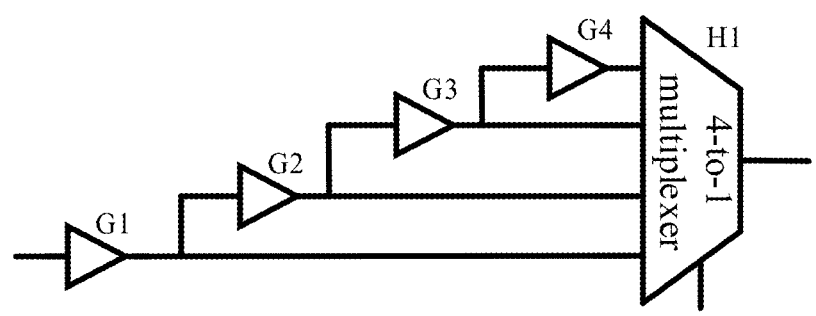
FIG. 4 is a circuit diagram of a delay module of the reliable multi-information entropy PUF for Internet of Things security according to the invention.

As shown in FIG. 4, in this embodiment, each delay module includes four buffers G1-G4 and a 4-to-1 multiplexer H1. The 4-to-1 multiplexer H1 has four input terminals, an output terminal and a selection terminal. The selection terminal of the 4-to-1 multiplexer H1 is the control terminal of the delay module, and the output terminal of the 4-to-1 multiplexer H1 is the output terminal of the delay module. Output terminals of the four buffers G1-G4 are connected to the four input terminals of the 4-to-1 multiplexer H1 in a one-to-one corresponding manner. The four buffers are referred to as a first buffer G1, a second buffer G2, a third buffer G3 and a fourth buffer G4 respectively. An input terminal of the first buffer G1 is the input terminal of the delay module. An input terminal of the second buffer G2 is connected to the output terminal of the first buffer G1, an input terminal of the third buffer G3 is connected to the output terminal of the second buffer G2, and an input terminal of the fourth buffer G4 is connected to the output terminal of the third buffer G3.

Under a 65 nm Complementary Metal-Oxide-Semiconductor (CMOS) process from Taiwan Semiconductor Manufacturing Co., Ltd. (TSMC), software cadence virtuoso is used to design the reliable multi-information entropy PUF for Internet of Things security (Glitch PUF) and the layout of the reliable multi-information entropy PUF for Internet of Things security of the invention. To verify the performance of the reliable multi-information entropy PUF for Internet of Things security of the invention, HSPICE is used to simulate the reliable multi-information entropy PUF for Internet of Things security. The reliable multi-information entropy PUF for Internet of Things security of the invention is evaluated with four common performance indicators, randomness, uniqueness, auto-correlation and stability according to test results.

1. Randomness

The randomness is calculated according to the probability of logic 1 output by a PUF circuit. Under an ideal condition, the probability of logic 0 is identical with the probability of logic 1, and the randomness is 100%. A formula (1) for calculating the randomness is as follows:

Randomness=(1−|2P(r=1)−1|)×100%    (1)

Figure 5:
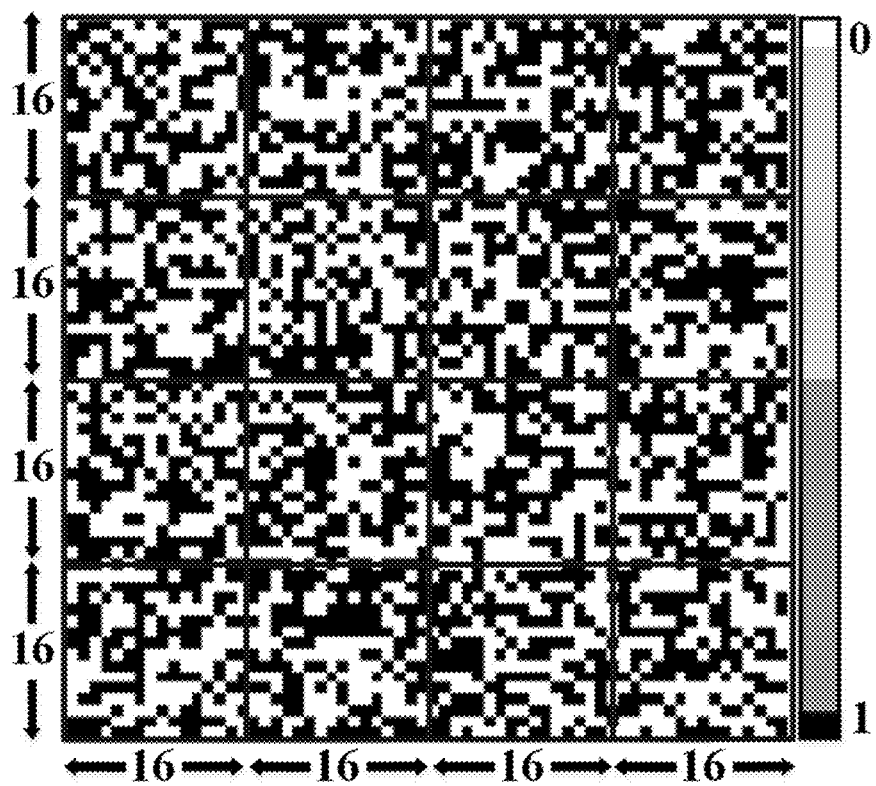
FIG. 5 is a gray picture of an output response of the reliable multi-information entropy PUF for Internet of Things security according to the invention.

In this formula (1), P(r=1) is the probability of logic 1 in a response. FIG. 5 is a gray picture obtained by testing 16 reliable multi-information entropy PUFs for Internet of Things security. In this picture, the white pixel represents logic 0 in output responses of the PUFs, and the black pixel represents logic 1 in the output responses of the PUFs. By statistics, the probability of logic 0 and the probability of logic 1 in the output responses are 49.95% and 50.05% respectively, which indicates that the reliable multi-information entropy PUF for Internet of Things security of the invention has good randomness.

The National Institute of Standards and Technology (NIST) test is a more strict and systematic method for testing and evaluating the randomness of PUFs. In the NIST test, p is evaluated to quantize output responses of the PUFs. Generally, if p is greater than 0.01, the randomness confidence of keys reaches 99%, and the randomness confidence of data will become higher with the increase of p. The NIST test is performed on the output response of the reliable multi-information entropy PUF for Internet of Things security, and the result is shown in Table 1. As can be seen from Table 1, the reliable multi-information entropy PUF for Internet of Things security of the invention can pass all applicable NIST tests, the average of p is high, which indicates that the PUF has high randomness.

TABLE 1

| Test Name | Steam Length | Run No. | Pass Rate | Avrg. P-Value | Pass? |
|---|---|---|---|---|---|
| Frequency | 6400 | 10 | 10/10 | 0.599 | Yes |
| Block Frequency | 6400 | 10 | 9/10 | 0.464 | Yes |
| Cumulative Sum-1 | 6400 | 10 | 10/10 | 0.836 | Yes |
| Cumulative Sum-2 | 6400 | 10 | 10/10 | 0.387 | Yes |
| Run | 6400 | 10 | 10/10 | 0.324 | Yes |
| Longest Run | 6400 | 10 | 10/10 | 0.664 | Yes |
| FFT | 6400 | 10 | 10/10 | 0.744 | Yes |
| Serial-1 | 6400 | 10 | 10/10 | 0.248 | Yes |
| Serial-2 | 6400 | 10 | 10/10 | 0.347 | Yes |
| Rank | 6400 | 10 | 10/10 | 0.408 | Yes |

2. Uniqueness

The uniqueness represents the degree of distinction between any individuals in the same type of PUFs, namely the capacity to generate digital information uniquely identifying itself, and is generally evaluated by calculating the Hamming distance (HD) between output responses of different individuals of the same type of PUFs. Under an ideal condition, the HD is 50% of the response length, and the average inter-chip HD $E(HD_{inter})$ of k PUFs is may be calculated according to formula (4) which is as follows:

$$E(HD_{inter}) = \frac{2}{k(k-1)} \sum_{i=1}^{k-1} \sum_{j=i+1}^{k} \frac{HD(r_i, r_j)}{n} \times 100\% \quad (4)$$

Figure 6:
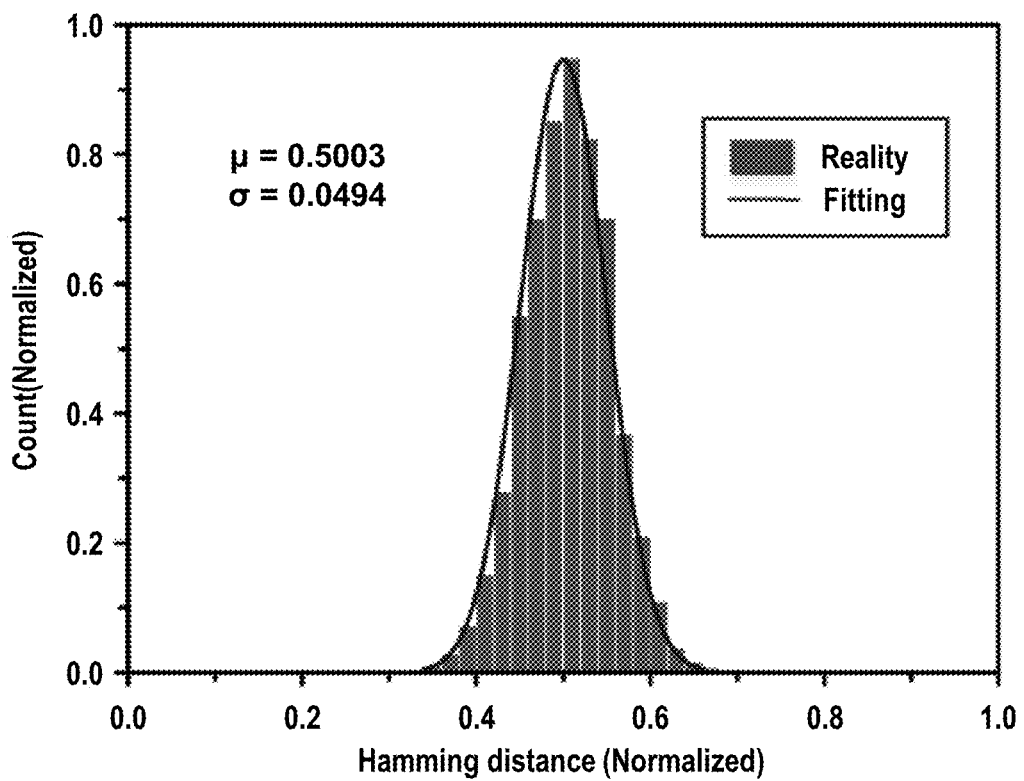
FIG. 6 is a chart of the Hamming distance of the reliable multi-information entropy PUF for Internet of Things security according to the invention.

In this formula (4), $r_i$ and $r_j$ respectively represent n bit responses generated by an $i^{th}$ PUF circuit and a $j^{th}$ PUF circuit under the same challenge. As shown in FIG. 6, the HD distribution of output responses of 50 Monte Carlo simulations meets the mathematical expectation μ=0.5003 and follows the normal distribution: standard deviation σ=0.0494. By calculation according to formula (4), $E(HD_{inter})$ is 50.03%, which is close to an ideal value.

3. Auto-Correlation

Figure 7:
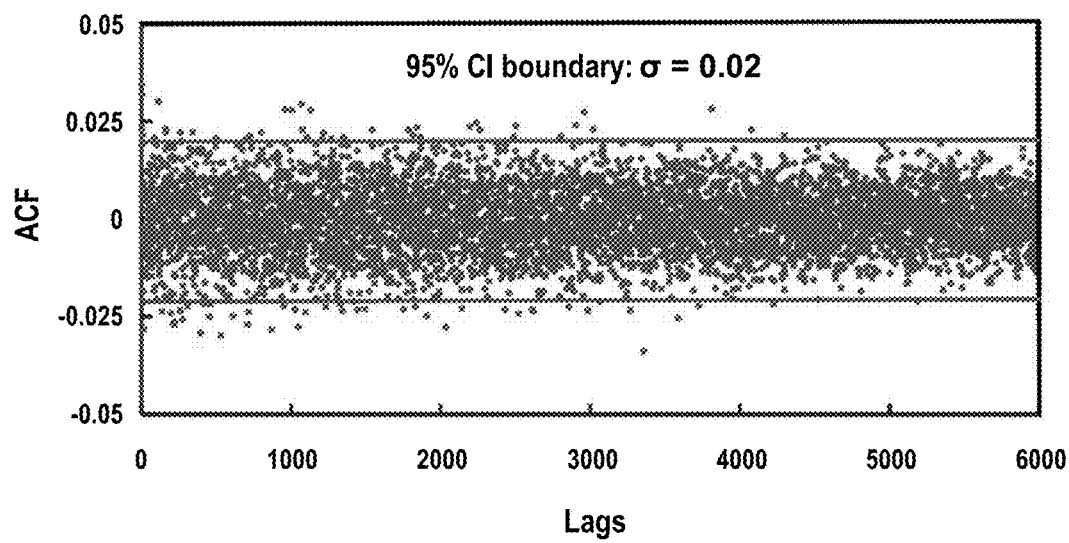
FIG. 7 is an auto-correlation function (ACF) diagram of the output response of the reliable multi-information entropy PUF for Internet of Things security according to the invention.

Different positions of a circuit module in chips may have an influence on the performance of the circuit, which is manifested by a functional relationship between generated data and PUF units in the PUF circuit, thus threatening the security of PUFs. Therefore, keys generated by the PUF circuit should be independent of the positions of the PUF units to be free of the influence of internal circuit layout. The spatial independence of the PUF circuit may be evaluated by means of an auto-correlation function (ACF). An ACT test is performed on output data of the reliable multi-information entropy PUF for Internet of Things security, and results are shown in FIG. 7. As can be seen from FIG. 7, in a 95% confidence interval of the reliable multi-information entropy PUF for Internet of Things security, standard deviation σ=0.02, and the average is close to 0, which indicates that each bit of data generated by the reliable multi-information entropy PUF for Internet of Things security is basically independent of the adjacent bit of data, and PUF data has no inevitable correlation with the layout.

4. Stability

Figure 8:
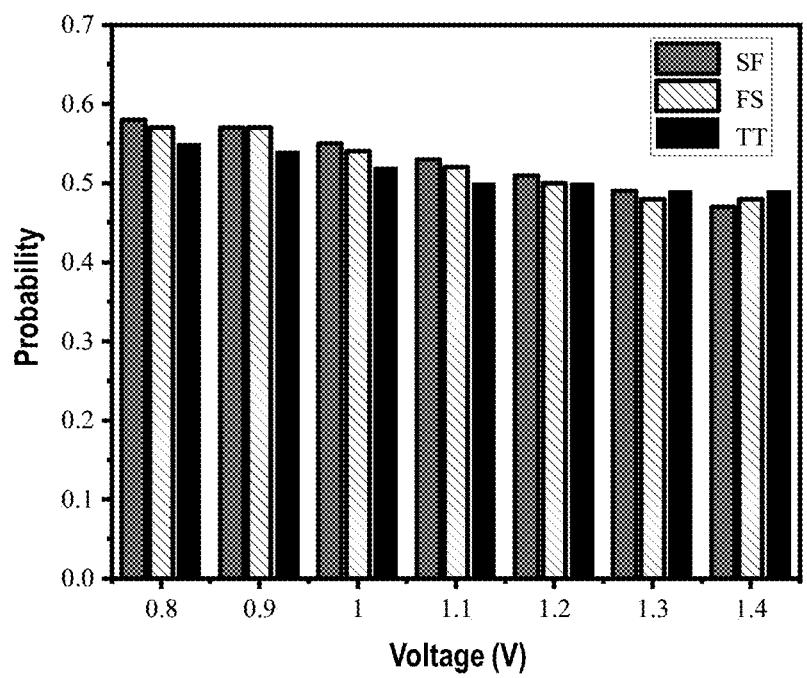
FIG. 8 is a diagram of the influence of voltage on the output response of the reliable multi-information entropy PUF for Internet of Things security according to the invention.
Figure 9:
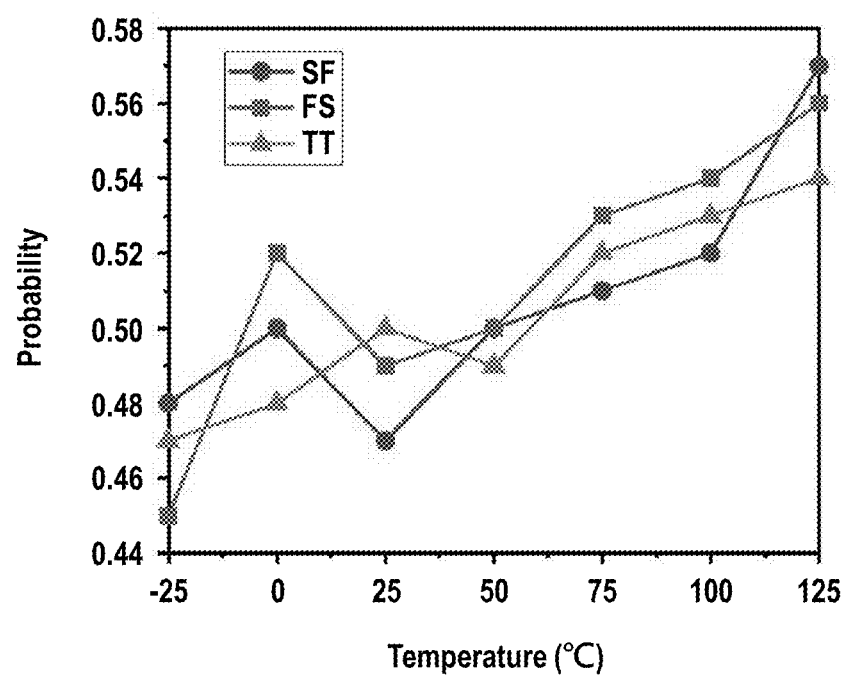
FIG. 9 is a diagram of the influence of temperature on the output response of the reliable multi-information entropy PUF for Internet of Things security according to the invention.

Temperature and voltage fluctuations have an impact on the stability of the circuit. To verify the robustness of the reliable multi-information entropy PUF for Internet of Things security against changes of supply voltage and temperature, as shown in FIG. 8, under three different process angles TT, SF and FS, when the supply voltage changes from 0.8 Volt (V) to 1.4V, the probability of logic 1 in the output response of the PUD has a downtrend. However, the number of logic 1 changes slightly, and is close to the ideal value 50%, which the reliable multi-information entropy PUF for Internet of Things security of the invention is hardly affected by voltage changes. Because the reliable multi-information entropy PUF for Internet of Things security is with a fully symmetrical structure and the number of devices on each path is completely the same, the reliable multi-information entropy PUF for Internet of Things security can resist voltage changes to some extent. As shown in FIG. 9, the reliable multi-information entropy PUF for Internet of Things security is tested, under three different process angles TT, SF and FS, the temperature changes from −25 degree Celsius (° C.) to 125° C., and the output response of the PUF circuit is measured every 25° C. As can be seen from FIG. 9, the number of logic 1 changes slightly under the three process angles TT, SF and FS, and the distribution of logic 0 and the distribution of logic 1 are both close to 50%. Therefore, the reliable multi-information entropy PUF for Internet of Things security is insensitive to voltage and temperature changes, indicating that the reliable multi-information entropy PUF for Internet of Things security has good stability.

Compared with the prior art, the invention has the following advantages: a reliable multi-information entropy PUF for Internet of Things security is constructed by a control circuit, a data register, 128 glitch generation circuits, a 128-to-1 multiplexer and a Schmidt glitch sampling module; the data register has an input terminal and an output terminal, each glitch generation circuit has an input terminal, an output terminal and a control terminal, the 128-to-1 multiplexer has 128 input terminals, a selection terminal and an output terminal, the Schmidt glitch sampling module has an input terminal and an output terminal, the control circuit is connected to the input terminal of the data register, the control terminal of each glitch generation circuit and the selection terminal of the 128-to-1 multiplexer, the output terminal of the data register is connected to the input terminals of the 128 glitch generation circuits, the output terminals of the 128 glitch generation circuits are connected to the 128 input terminals of the 128-to-1 multiplexer in a one-to-one corresponding manner, the output terminal of the 128-to-1 multiplexer is connected to the input terminal of the Schmidt glitch sampling module, the control circuit is used for controlling the data register to generate a square signal that is output via the output terminal of the data register to control the 128 glitch generation circuits to generate glitch signals to be output and control the 128-to-1 multiplexer to select the glitch signals to be output, the Schmidt glitch sampling module is used for sampling glitch signals input thereto to obtain a PUF response output, each glitch generation circuit generates a glitch signal by means of a fully symmetrical structure, the Schmidt glitch sampling module comprises a first PMOS transistor, a second PMOS transistor, a third PMOS transistor, a fourth PMOS transistor, a first NMOS transistor, a second NMOS transistor, a third NMOS transistor, a fourth NMOS transistor, a buffer module and a D flip-flop, the buffer module is formed by n buffers that are connected in series, n is an integer greater than or equal to 2, an input terminal of the first buffer is an input terminal of the buffer module, an output terminal of the $j^{th}$ buffer is connected to an input terminal of the $(j+1)^{th}$ buffer, j=1, 2, . . . , n−1, an output terminal of the $n^{th}$ buffer is an output terminal of the buffer module, the D flip-flop has a clock terminal, an input terminal and an output terminal, a power source is accessed to a source terminal of the first PMOS, a source terminal of the fourth PMOS transistor and a drain terminal of the third NMOS transistor, a drain terminal of the first PMOS transistor, a source terminal of the second PMOS transistor and a source terminal of the third PMOS transistor are connected, a gate terminal of the first PMOS transistor, a gate terminal of the second PMOS transistor, a gate terminal of the first NMOS transistor and a gate terminal of the second NMOS transistor are connected and a connecting terminal is the input terminal of the Schmidt glitch sampling module, a drain terminal of the second PMOS transistor, a drain terminal of the first NMOS transistor, a gate terminal of the third PMOS transistor, a gate terminal of the third NMOS transistor, a gate terminal of the fourth PMOS transistor and a gate terminal of the fourth NMOS transistor are connected, a drain terminal of the third PMOS transistor is grounded, a drain terminal of the fourth PMOS transistor, a drain terminal of the fourth NMOS transistor, the input terminal of the buffer module and the input terminal of the D flip-flop are connected, a source terminal of the first NMOS transistor, a drain terminal of the second NMOS transistor and a source terminal of the third NMOS transistor are connected, a source terminal of the second NMOS transistor is grounded, a source terminal of the fourth NMOS transistor is grounded, the output terminal of the buffer module and the clock terminal of the D flip-flop are connected, and the output terminal of the D flip-flop is the output terminal of the Schmidt glitch sampling module; in the Schmidt glitch sampling module, the first PMOS transistor, the second PMOS transistor, the third PMOS transistor, the fourth PMOS transistor, the first NMOS transistor, the second NMOS transistor, the third NMOS transistor and the fourth NMOS transistor form a Schmidt denoising module, and the buffer module and the D flip-flop form a glitch width detection module, wherein the first PMOS transistor and the second PMOS transistor are stacked and are used for pulling up the level of a node Z (a connecting node of the drain terminal of the second PMOS transistor, the drain terminal of the first NMOS transistor, the gate terminal of the third PMOS transistor, the gate terminal of the third NMOS transistor, the gate terminal of the fourth PMOS transistor and the gate terminal of the fourth NMOS transistor), the first NMOS transistor and the second NMOS transistor are stacked and are used for pulling down the level of the node Z, and the third PMOS transistor and the third NMOS transistor are used as feedback resistors and output feedback signals to increase the switching threshold of the Schmidt denoising module; when a level 0 is accessed to the input terminal of the Schmidt glitch sampling module, an output node OUT of the Schmidt denoising module (a connecting node of the drain terminal of the fourth PMOS transistor and the drain terminal of the fourth NMOS transistor) is 0, and the third NMOS transistor is turned on; when the level accessed to the input terminal of the Schmidt glitch sampling module transits from 0 to 1, the third NMOS transistor increases the potential of the source terminal of the second NMOS transistor to keep the output node OUT to be 1, at this point, the voltage of an intermediate node X (a connecting node of the source terminal of the first NMOS transistor, the drain terminal of the second NMOS transistor and the source terminal of the third NMOS transistor) increases, which makes a voltage between the source terminal of the first NMOS transistor and a substrate over 0, and increases the threshold voltage of the first NMOS transistor, so that the Schmidt denoising module generates a higher switching threshold; when a level 1 is accessed to the input terminal of the Schmidt glitch sampling module, the output node OUT of the Schmidt denoising module is 1, the second PMOS transistor is turned on, a node Y (a connecting node of the drain terminal of the first PMOS transistor, the source terminal of the second PMOS transistor and the source terminal of the third PMOS transistor) discharges through the second PMOS transistor, and at this moment, the switching threshold of the Schmidt denoising module is increased through a feedback mechanism when the input signal transits from 1 to 0; through the feedback transistors of the Schmidt denoising module, hysteretic output signals are generated, and the noise immunity of the Schmidt glitch sampling module is improved; stable glitch signals obtained by the Schmidt denoising module are sampled by the glitch width detection module, and the delay of the buffer module in the glitch width detection module is set according to the width of glitch signals; when the width of the glitch signals is equal to the delay of the buffer module, the probability that the D flip-flop samples the glitch signals is 50% theoretically; when the width of the glitch signals is greater than the delay of the buffer module, the glitch signals can be smoothly sampled, and the output terminal of the Schmidt glitch sampling module outputs logic 1; otherwise, the output terminal of the Schmidt glitch sampling module outputs logic 0; the Schmidt glitch sampling module can filter out noise to obtain stable glitch signals generated by the glitch generation circuits and can obtain robust PUF responses by detecting the width of the glitch signals, thus being able to generate stable output responses, unlikely to be affected by temperature and voltage fluctuations, and high in reliability.

What is claimed is:

1. A reliable multi-information entropy physical unclonable function (PUF) for Internet of Things security, comprising a control circuit, a data register, 128 glitch generation circuits, a 128-to-1 multiplexer, and a Schmidt glitch sampling module, wherein the data register has an input terminal and an output terminal, each one of the 128 glitch generation circuits has an input terminal, an output terminal and a control terminal, the 128-to-1 multiplexer has 128 input terminals, a selection terminal and an output terminal, the Schmidt glitch sampling module has an input terminal and an output terminal, wherein the control circuit is connected to the input terminal of the data register, the control terminal of each one of the 128 glitch generation circuits, and the selection terminal of the 128-to-1 multiplexer, wherein the output terminal of the data register is connected to the input terminals of the 128 glitch generation circuits, wherein the output terminals of the 128 glitch generation circuits are connected to the 128 input terminals of the 128-to-1 multiplexer in a one-to-one corresponding manner, wherein the output terminal of the 128-to-1 multiplexer is connected to the input terminal of the Schmidt glitch sampling module, wherein the control circuit is used for controlling the data register to generate a square signal that is output via the output terminal of the data register to control the 128 glitch generation circuits to generate glitch signals to be output and to control the 128-to-1 multiplexer to select the glitch signals to be output, wherein the Schmidt glitch sampling module is used for sampling the glitch signals that is input to the Schmidt glitch sampling module to obtain a PUF response output, wherein each one of the 128 glitch generation circuits generates one of the glitch signals via a fully symmetrical structure, wherein the Schmidt glitch sampling module comprises a first p-type metal-oxide-semiconductor (PMOS) transistor, a second PMOS transistor, a third PMOS transistor, a fourth PMOS transistor, a first n-type metal-oxide-semiconductor (NMOS) transistor, a second NMOS transistor, a third NMOS transistor, a fourth NMOS transistor, a buffer module and a D flip-flop, wherein the buffer module is formed by n buffers that are connected in series, n is an integer greater than or equal to 2, wherein an input terminal of a first buffer of the n buffers is an input terminal of the buffer module, an output terminal of a $j^{th}$ buffer of the n buffers is connected to an input terminal of a $(j+1)^{th}$ buffer of the n buffers, j is an integer which is in a range of 1 to n−1, wherein an output terminal of a $n^{th}$ buffer of the buffers is an output terminal of the buffer module, wherein the D flip-flop has a clock terminal, an input terminal and an output terminal, wherein a power source is accessed to a source terminal of the first PMOS transistor, a source terminal of the fourth PMOS transistor and a drain terminal of the third NMOS transistor, wherein a drain terminal of the first PMOS transistor, a source terminal of the second PMOS transistor and a source terminal of the third PMOS transistor are connected, wherein a gate terminal of the first PMOS transistor, a gate terminal of the second PMOS transistor, a gate terminal of the first NMOS transistor and a gate terminal of the second NMOS transistor are connected to a first connecting terminal which is the input terminal of the Schmidt glitch sampling module, wherein a drain terminal of the second PMOS transistor, a drain terminal of the first NMOS transistor, a gate terminal of the third PMOS transistor, a gate terminal of the third NMOS transistor, a gate terminal of the fourth PMOS transistor and a gate terminal of the fourth NMOS transistor are connected, wherein a drain terminal of the third PMOS transistor is grounded, wherein a drain terminal of the fourth PMOS transistor, a drain terminal of the fourth NMOS transistor, the input terminal of the buffer module and the input terminal of the D flip-flop are connected, wherein a source terminal of the first NMOS transistor, a drain terminal of the second NMOS transistor and a source terminal of the third NMOS transistor are connected, a source terminal of the second NMOS transistor is grounded, wherein a source terminal of the fourth NMOS transistor is grounded, wherein the output terminal of the buffer module and the clock terminal of the D flip-flop are connected, and the output terminal of the D flip-flop is the output terminal of the Schmidt glitch sampling module.

2. The reliable multi-information entropy PUF for Internet of Things security according to claim 1, wherein each glitch generation circuit of the 128 glitch generation circuits comprises four two-input OR gates that are identical in structure, four inverters that are identical in structure, two buffers that are identical in structure, two two-input AND gates that are identical in structure, a two-input XOR gate, and eight delay modules that identical in structure, wherein each one of the four two-input OR gates has a first input terminal, a second input terminal and an output terminal, each one of the two two-input AND gates has a first input terminal, a second input terminal and an output terminal, the two-input XOR gate has a first input terminal, a second input terminal and an output terminal, and each one of the eight delay modules has an input terminal, an output terminal and a control terminal, wherein the first input terminals and the second input terminals of the fourth two-input OR gates are connected to a second connecting terminal which is the input terminal of the glitch generation circuit, wherein an output terminal of a first two-input OR gate of the four two-input OR gates is connected to an input terminal of a first inverter of the four inverters, an output terminal of a second two-input OR gate of the four two-input OR gates is connected to an input terminal of the first buffer, an output terminal of a third two-input OR gate of the four two-input OR gates is connected to an input terminal of a second inverter of the four inverters, an output terminal of a fourth two-input OR gate of the four two-input OR gates is connected to the input terminal of the second buffer, wherein an output terminal of the first inverter is connected to an input terminal of a first delay module of the eight delay modules, an output terminal of the first buffer is connected to an input terminal of a second delay module of the eight delay modules, an output terminal of the second inverter is connected to an input terminal of a third delay module of the eight delay modules, the output terminal of the second buffer is connected to the input terminal of the fourth delay module of the eight delay modules, wherein an output terminal of the first delay module is connected to a first input terminal of a first two-input AND gate of the two two-input AND gates, an output terminal of the second delay module is connected to a second input terminal of the first two-input AND gate, an output terminal of the third delay module is connected to a first input terminal of a second two-input AND gate of the two two-input AND gates, an output terminal of the fourth delay module of the eight delay modules is connected to a second input terminal of the second two-input AND gate, an output terminal of the first two-input AND gate is connected to an input terminal of the fifth delay module of the eight delay modules and an input terminal of the sixth delay module of the eight delay modules, an output terminal of the second two-input AND gate is connected to an input terminal of the seventh delay module of the eight delay modules and an input terminal of an eighth delay module of the eight delay modules, wherein an output terminal of the fifth delay module and an output terminal of the sixth delay module are connected to an input terminal of a third inverter of the four inverters, an output terminal of the seventh delay module and an output terminal of the eighth delay module are connected to an input terminal of a fourth inverter of the four inverters, an output terminal of the third inverter is connected to a first input terminal of the two-input XOR gate, an output terminal of the fourth inverter is connected to a second input terminal of the two-input XOR gate, an output terminal of the two-input XOR gate is the output terminal of the glitch generation circuit, and the control terminals of the eight delay modules are connected to a third connecting terminal which is the control terminal of the glitch generation circuit.

3. The reliable multi-information entropy PUF for Internet of Things security according to claim 2, wherein each delay module of the eight delay modules comprises four buffers and a 4-to-1 multiplexer, wherein the 4-to-1 multiplexer has four input terminals, an output terminal and a selection terminal, wherein the selection terminal of the 4-to-1 multiplexer is the control terminal of the delay module, the output terminal of the 4-to-1 multiplexer is the output terminal of the delay module, output terminals of the four buffers are connected to the four input terminals of the 4-to-1 multiplexer in a one-to-one corresponding manner, wherein the four buffers comprise a first buffer, a second buffer, a third buffer and a fourth buffer, an input terminal of the first buffer is the input terminal of the delay module, an input terminal of the second buffer is connected to the output terminal of the first buffer, an input terminal of the third buffer is connected to the output terminal of the second buffer, and an input terminal of the fourth buffer is connected to the output terminal of the third buffer.

* * * * *